United States Patent [19]

Gibbs

[11] Patent Number: 4,933,899

[45] Date of Patent: Jun. 12, 1990

[54] BI-CMOS SEMICONDUCTOR MEMORY CELL

[75] Inventor: Gary A. Gibbs, San Jose, Calif.

[73] Assignee: Cypress Semiconductor, San Jose, Calif.

[21] Appl. No.: 305,384

[22] Filed: Feb. 1, 1989

[51] Int. Cl.⁵ .................... G11C 11/40; G11C 7/00
[52] U.S. Cl. .................................. 365/177; 365/154;
365/230.05; 365/190; 365/174; 307/530;
307/279
[58] Field of Search ........... 365/174, 177, 190, 230.05,
365/154, 156, 205; 307/530, 279

[56] References Cited

U.S. PATENT DOCUMENTS 4,701,883 10/1987 Wrathall et al. .................... 365/154
4,779,230 10/1988 McLaughlin et al. ........... 365/177 X
4,839,862 6/1989 Shiba et al. ......................... 365/177

FOREIGN PATENT DOCUMENTS 58-26392 2/1983 Japan .................................... 365/177

Primary Examiner—Stuart N. Hecker

Attorney, Agent, or Firm—Blakely, Sokoloff, Taylor & Zafman

[57] ABSTRACT

A Bi-CMOS ECL semiconductor memory cell having a read word line, a write word line and a read bit line is disclosed. The cell includes a bistable circuit having complimentary outputs and also includes a first transfer device and a second transfer device, each having a gate electrode and a current path, the gate electrode of one transfer device being coupled to one of the complimentary outputs of the bistable circuit and the gate of the other transfer device being coupled to the other complimentary output, and the two current paths of the two transfer devices being coupled in series between the read word line and a first reference voltage. The cell further includes a bipolar transistor device having a base, a collector and an emitter. The base is coupled between the two current paths of the two transfer devices and one end of the current path formed between the collector and the emitter of the bipolar transistor being coupled to a second reference (high supply) voltage while the other end of that current path is coupled to the read bit line.

11 Claims, 3 Drawing Sheets

FIG_1 (PRIOR ART)
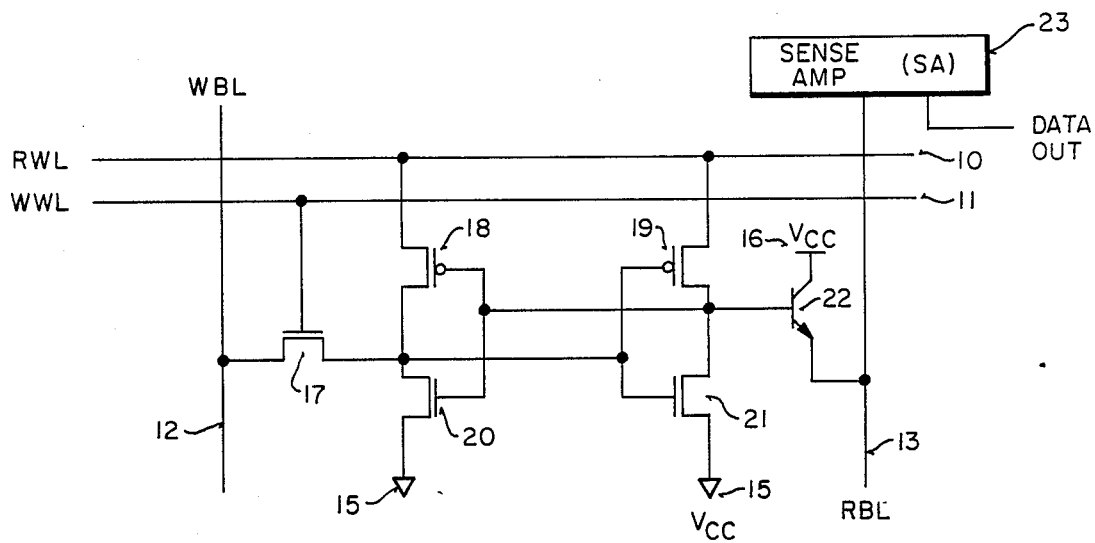
FIG_2
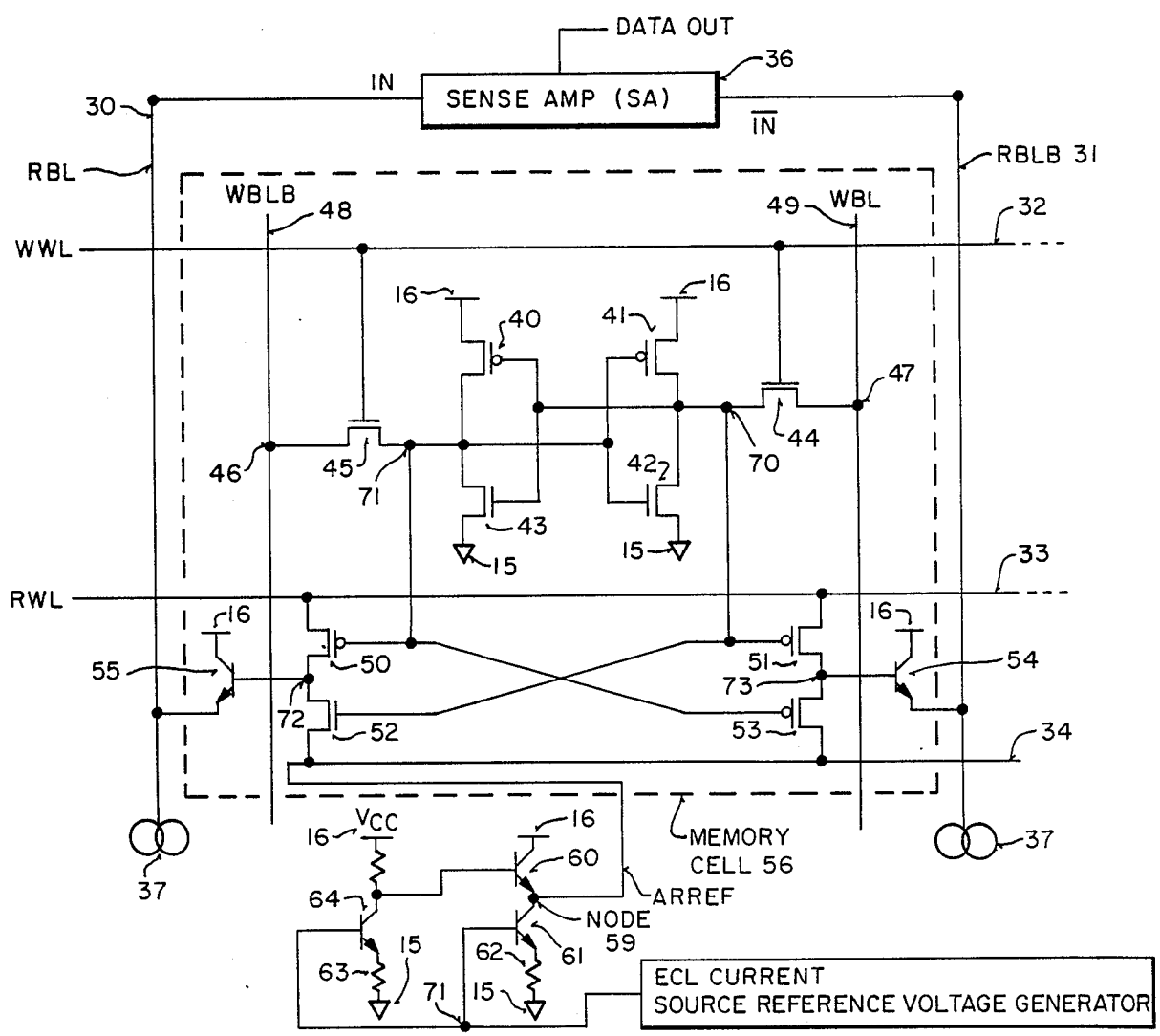

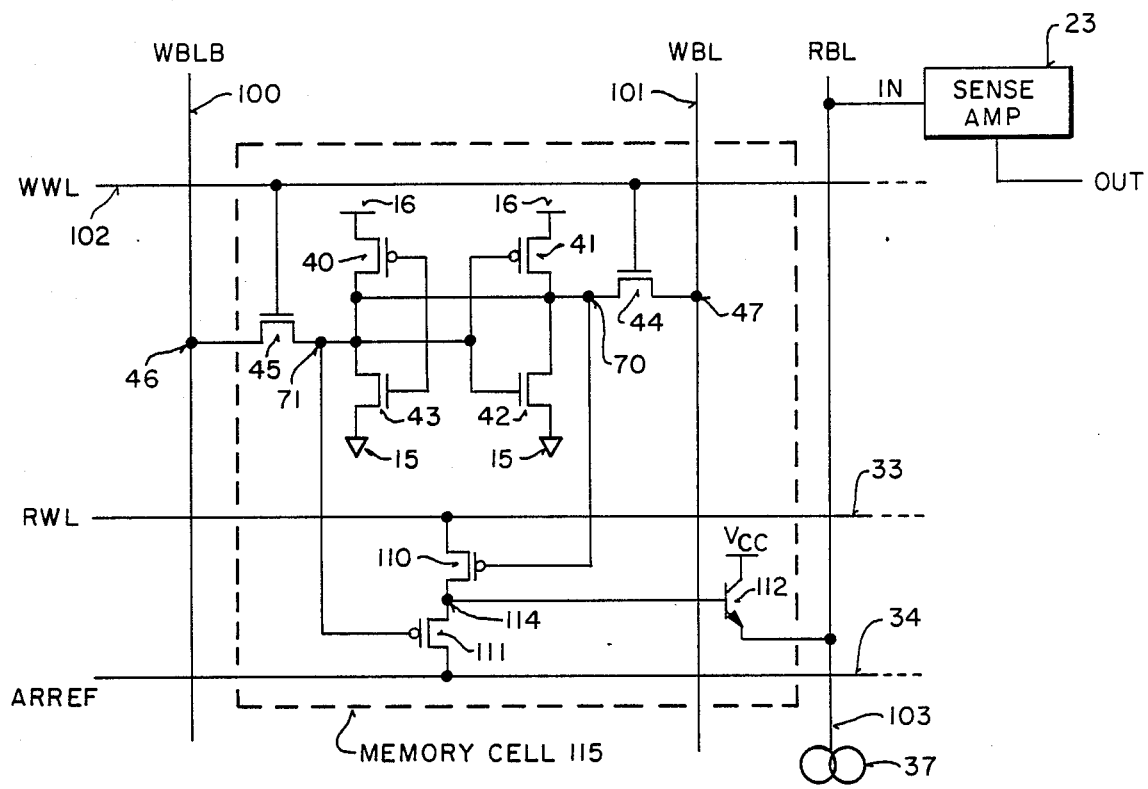

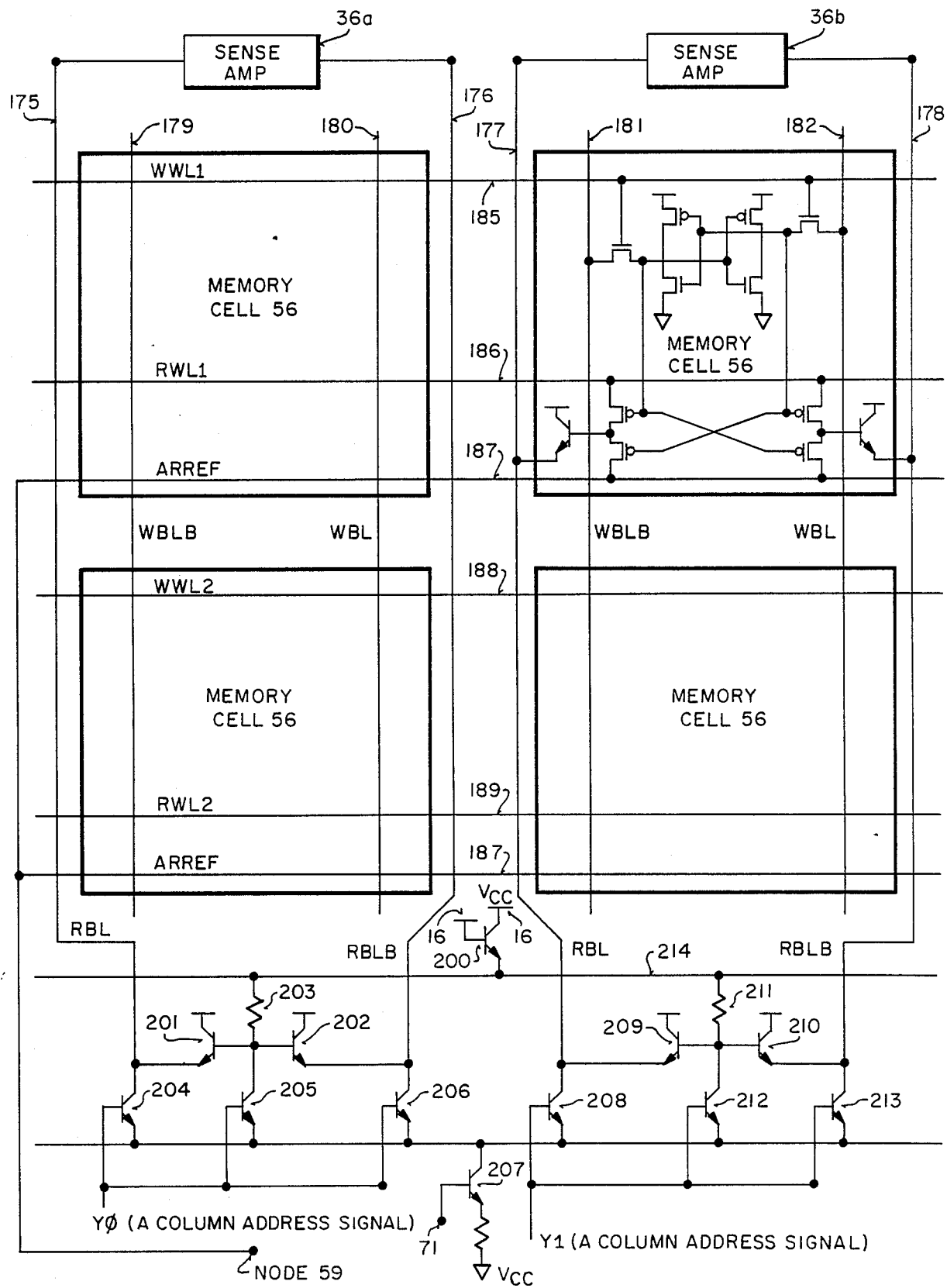
FIG_5

BI-CMOS SEMICONDUCTOR MEMORY CELL

BACKGROUND OF THE INVENTION

The field of this invention relates to semiconductor memory devices and particularly to semiconductor memory cells comprising a combination of bipolar junction transistor technology and CMOS (complimentary metal oxide semiconductor) technology. More particularly, this invention relates to a Bi-CMOS (bipolar and CMOS) semiconductor memory cell for reading, writing and storing binary data.

Prior art Bi-CMOS semiconductor memory cells are often used where high speed in retrieving information from the memory cells is important. The high speed of these devices is significantly contributed to by the use of the bipolar transistors in conjunction with the MOS (metal oxide semiconductor) field effect transistors.

These Bi-CMOS semiconductor memory cells are typically faster (e.g., data may be retrieved more quickly) than semiconductor memory cells which utilize solely MOS or CMOS technology. An example of a prior art CMOS memory cell is shown in FIG. 2b (as memory cell 21) of U.S. Pat. No. 4,785,427. It can be seen from memory cell 21 in FIG. 2b of that patent that no bipolar devices are used to construct the memory cell 21. Consequently, these memory cells, constructed from field effect devices only, do not have the high speed bipolar inputs and outputs; moreover, these MOS and CMOS semiconductor memory cells do not have the stability over various temperatures and voltages of memory cells which utilize high speed bipolar inputs and outputs which have address accessing time that is relatively independent of voltage and temperature fluctuations. Accordingly, attempts have been made in the prior art to construct semiconductor memory cells which combine MOS field effect devices with bipolar devices; moreover, attempts have been made to combine CMOS configurations of MOS field effect devices with bipolar transistors in order to achieve faster reading and writing times.

An example of a prior art Bi-CMOS semiconductor memory cell is shown in FIG. 1. FIG. 1 shows a Bi-CMOS semiconductor memory cell (which has a single ended read line and a single ended write line) having MOS devices 17, 18, 19, 20 and 21 and the npn bipolar transistor 22. The p-channel MOS field effect devices 18 and 19 and the n-channel field effect devices 20 and 21 are coupled in the conventional, (so called) cross coupled inverter configuration to yield a bistable circuit means which has complimentary outputs. That is, the outputs of the bistable circuit means formed by MOS devices 18, 19, 20 and 21 have outputs which are complimentary (one output is the binary logical inverse of the other). MOS field effect device 17 couples the bistable circuit means to a write bit line 12 through the source/drain current path of device 17. The gate of device 17 is coupled to the write word line 11 which is taken high during writing to permit the data provided on the write bit line 12 to be read into the bistable circuit means during writing. The read word line 10 is coupled to the sources of p-channel devices 18 and 19 and the sources of n-channel devices 20 and 21 are coupled to $V_{ee}$ 15 which is a supply voltage, typically $-5.2V$. The bipolar transistor 22 includes a base and a collector and an emitter. As shown in FIG. 1, the base of bipolar transistor 22 is coupled to one of the complimentary outputs of the bistable circuit means formed by devices 18, 19, 20 and 21. The collector of bipolar transistor 22 is coupled to a supply voltage $V_{cc}$ 16 which is typically a power supply voltage (e.g., reference voltage), such as ground. It will be appreciated by those in the art that the semiconductor memory cell in FIG. 1 will typically utilize ECL (emitter coupled logic) logic levels so that $V_{cc}$ will typically be 0 volts and that $V_{ee}$ will be $-5.2V$. The emitter of bipolar transistor 22 is coupled to the read bit line 13 which is coupled to sense amplifier 23.

The Bi-CMOS ECL semiconductor memory cell shown in FIG. 1 is a static random access, read, write memory cell which has fast reading and writing times to permit high speed retrieval and writing of data. It will be appreciated that standard and well known peripheral circuitry used to select a particular cell in an array containing these cells will be utilized to activate the write word line and the read word line during writing and reading respectively. Moreover, it will be appreciated by those in the art that conventional, well known peripheral circuitry will be coupled to the write bit line 12 to provide input to the cell to write data into the cell during writing of the memory cell shown in FIG. 1. The Bi-CMOS ECL semiconductor memory cell shown in FIG. 1 will effect the status of the read bit line 13 and hence the output of a conventional sense amp 23 through the high speed bipolar transistor 22. Hence, the Bi-CMOS semiconductor cell shown in FIG. 1 will have improved speed as compared to semiconductor memory cells utilizing solely MOS field effect devices. However, the semiconductor memory cell in FIG. 1 has numerous disadvantages. For example, the reliability over time of the memory cell decreases because during normal operation the emitter base junction of the bipolar transistor 22 can become reversed biased by approximately 4 volts which causes hot electron trapping in the oxide around the junction between the emitter and the base of the transistor. This consequently decreases the beta of the transistor and long term reliability of the memory cell. The reverse biasing of transistor 22 occurs when the base of transistor 22 is pulled low with respect to the emitter of transistor 22, thereby reverse biasing the base/emitter junction of transistor 22. Moreover, the p-channel field effect devices 18 and 19 cannot be optimized for both read and write operations separately from the design considerations involved in driving the base of the bipolar transistor 22.

It is an object of the invention to provide a static, random access, read, write Bi-CMOS memory cell using ECL logic that has fast read and write time and fast recovery while also providing high reliability and high immunity against alpha particle induced soft errors (e.g., corruption of data). Moreover, it is an object of the invention that the semiconductor memory cell utilize the low power advantages of CMOS circuitry while at the same time providing high speed reading and writing with high reliability. Moreover, it is an object of the invention to provide a Bi-CMOS semiconductor memory cell wherein the complimentary output from the bistable CMOS flip-flop circuit means does not have to drive directly the base of the bipolar transistor drivers which drive the read bit lines.

SUMMARY OF THE INVENTION

This invention provides a Bi-CMOS semiconductor memory cell for storing binary data. The semiconductor memory cell includes a bistable flip-flop circuit means which is comprised of two cross coupled CMOS inverters having complimentary outputs. The semiconductor memory cell of the invention further includes at least two transfer devices each having a gate electrode and a current path. One gate electrode of one transfer device is coupled to one of the complimentary outputs of the bistable circuit means and the gate electrode of the other transfer device is coupled to the other complimentary output of the bistable circuit means. The two transfer devices each have a current path, and the two current paths are coupled in series between a read word line and a first reference voltage. The semiconductor memory cell of the present invention further includes a bipolar transistor device or other transistor means which drives the read bit line. The transistor means has a control electrode (e.g. a base in the case of a bipolar device or a gate electrode in the case of a MOS field effect transistor) and has two other electrodes forming a current path (e.g., a source and drain current path in the case of a MOS field effect transistor). If a bipolar transistor device is used, it includes a base and a collector and an emitter. The collector and emitter form a current path having two ends. The base of the bipolar transistor device is coupled between the two current paths of the two transfer devices. One end of the current path (e.g., the collector) of the bipolar transistor is coupled to a second reference voltage ($V_{cc}$ supply voltage) and the other end of that current path (e.g., the emitter) is coupled to the read bit line to drive the read bit line.

In a particular embodiment of the invention, the memory cell is coupled between differential read bit lines (read bit line and read bit line bar) and two sets of a pair of transfer devices are coupled in series between the read word line and the first reference voltage (array reference voltage—ARREF). In this particular embodiment, two separate bipolar transistors drive two separate bit lines. The base of one bipolar transistor is coupled between the current paths of one set of transfer devices, and the base of the other bipolar transistor is coupled between the current paths of the other set of transfer devices. During a read operation, one pair of transfer devices couples the base of one bipolar transistor to the read word line and the other pair of transfer devices couples the base of the other bipolar transistor to the first reference voltage (array reference voltage). This coupling of the bases prevents any base/emitter junction from being reverse biased.

DESCRIPTION OF THE DRAWINGS

FIG. 1 is a schematic illustration of a prior art semiconductor memory cell which is typically used in an array of memory cells arranged by rows and columns.

FIG. 2 is a schematic illustration of one embodiment of the present invention.

FIG. 3 is a schematic illustration of another embodiment of the present invention.

FIG. 4 is a schematic illustration showing an alternative Bi-CMOS ECL semiconductor memory cell.

FIG. 5 is a schematic illustration of an array of semiconductor memory cells and further shows an example of an embodiment of a constant current source.

DETAILED DESCRIPTION OF THE INVENTION

The present invention, will be described with reference to the drawings which illustrate particular embodiments of the invention. Specific details pertinent to the invention will be described for a thorough understanding of the invention; however, in order not to unnecessarily obscure the invention, certain items will be described in general terms as they are well understood by those ordinarily skilled in the art, particularly in the art of ECL logic. Thus, well known circuits and general architectures of semiconductor memories will be referred to or will be illustrated in block diagrams and described generally.

The general architecture of semiconductor memories is well known in the art and may be explored by reference to various text books and patents (e.g., *Introduction to VLSI Systems*, C. Mead and L. Conway, Addison-Wesley, 1980). As is well known, the general architecture of semiconductor memories includes columns of memory cells and arranged across a group of columns are rows of memory cells, such as those shown in FIG. 5 in this invention or in FIG. 1 of U.S. Pat. No. 4,785,427. Each column in the array of memory cells is formed by a single bit line or, in the case of differential bit lines a read bit line and a read bit line bar. An example of the latter architecture is shown in FIG. 1 of U.S. Pat. No. 4,785,427 and also in FIG. 5 of the present invention. In this architecture which uses a pair of differential bit lines (read bit line and read bit line bar which is complimentary to the read bit line) a conventional differential sense amplifier is coupled between the pair of differential bit lines to sense the state of the memory cell which is selected in the column. The other well known architecture for semiconductor memories utilizes a single read bit line with the sense amplifier coupled to that read bit line. An example of that architecture is shown in FIG. 1.

The preferred Bi-CMOS ECL semiconductor memory of the present invention is shown in FIG. 2. FIG. 2 shows a 12 transistor cell which is a dual port random access memory cell with one read port and one write port. The read port has a bipolar path through bipolar transistors 54 and 55. The write port has an MOS path through MOS pass transistors 44 and 45. The write port uses a write word line 32 and a pair of differential write bit lines (write bit line 49 and write bit line bar 48).

The binary data which is stored in the semiconductor memory cell is retained by the bistable flip-flop CMOS circuit means formed by MOS devices 40, 41, 42 and 43. It will be appreciated that these four MOS field effect devices comprise two cross coupled CMOS inverters. The complimentary outputs of the bistable circuit means (formed by p-channel MOS devices 40 and 41 and the n-channel MOS devices 42 and 43) are coupled to nodes 70 and 71 shown in FIG. 2. The sources of p-channel MOS field effect devices 40 and 41 are coupled to the supply voltage $V_{cc}$. The sources of the n-channel enhancement MOS field effect devices 42 and 43 are coupled to the supply voltage $V_{ee}$ 15. For this particular embodiment, ECL logic is utilized and therefore $V_{cc}$ (16) is set at 0 volts and $V_{ee}$ (15) is set at −5.2V. It will be apparent that other voltage levels with appropriate differences between the two supply voltages (reference voltages) may be utilized. The drains of MOS field effect devices 41 and 42 are coupled together, and the drains of MOS devices 40 and 43 are coupled together. The drains of devices 40 and 43 are coupled to one of the complimentary outputs node 71 of the bistable circuit means, and the drains of devices 41 and 42 are coupled to the other complimentary output node 70 of the bistable circuit means.

The complimentary output node 70 is coupled to the conventional write bit line 49 at node 47 through the pass transistor 44 which is an n-channel enhancement MOS field effect device. Similarly, a complimentary output node 71 is coupled to the conventional write bit line bar 48 at node 46 through the source/drain current path of the n-channel enhancement MOS field effect device 45. The gates of devices 44 and 45 are coupled to a conventional write word line 32. The write operation is accomplished in the well known manner by pulling the write word line 32 high and by then pulling one of the two write bit lines low (while the other is high). For example, writing is performed by pulling write word line 32 high (approximately 0 volts) while pulling write bit line 49 low and write bit line bar 48 remains high; in this case, the pass gates 44 and 45 will allow the signals from the write bit lines to be applied to the nodes 71 and 72 to cause the bistable circuit means to store the appropriate logic level values; that is, node 70 will be pulled low and node 71 will be high. After writing, the write word line 32 is pulled low (e.g., approximately −5.2V) in the conventional manner, and the data stored in the bistable circuit means remains stable so that it may be read from the memory cell.

The Bi-CMOS ECL semiconductor memory cell shown in FIG. 2 further includes two sets of transfer devices which comprise four identical p-channel enhancement MOS field effect devices 50, 51, 52, and 53. Devices 51 and 53 form one pair of transfer devices; and devices 50 and 52 form the other pair of transfer devices. Each pair of transfer devices includes a first and a second transfer MOS device. For example, MOS devices 51 and 53 are the first and second transfer MOS devices for the transfer pair formed by devices 51 and 53. Each transfer MOS device includes a gate electrode and a current path between its source and drain. Thus, each pair of transfer devices has two current paths which are coupled in series between the read word line 33 and the array reference line 34. The array reference line 34 provides a first reference voltage at node 59 through the circuit shown coupled to node 59, including the conventional ECL current source reference voltage generator 70. Associated with each pair of transfer devices is a bipolar transistor device, such as bipolar transistor 54. It can be seen from FIG. 2 that bipolar transistor 54 is associated with the pair of transfer devices 51 and 53, and similarly bipolar transistor 55 is associated with transfer devices 50 and 52.

Each bipolar transistor device includes a base and a collector and an emitter. The collector and emitter for each bipolar transistor device form a current path having two ends, one end of which is coupled to the supply voltage $V_{cc}$ and the other end being coupled to a read bit line or a read bit line bar. Specifically, it can be seen from FIG. 2, that the current path of bipolar transistor 54 formed by the collector and emitter of that transistor is coupled between $V_{cc}$ 16 and the read bit line bar 31. Similarly, the emitter of transistor 55 is coupled to the read bit line 30, and the collector of bipolar transistor 55 is coupled to $V_{cc}$ 16. The bipolar transistor is used as an emitter follower, and the voltage at the emitter is approximately 0.8 volts lower than the voltage at the base. The collector of the bipolar device is typically connected to the highest voltage supply, which is typically $V_{cc}$ and the emitter is connected to the read bit lines. It will be appreciated by those ordinarily skilled in the art that a PNP bipolar transistor may be used rather than the NPN bipolar transistors shown in the embodiment of FIG. 2. In this case, it will be appreciated that the collector will be coupled to the lowest voltage supply source and the emitter will be coupled to the read bit line.

It can be seen from FIG. 2 that the base of bipolar transistor 54 is coupled between the two current paths at node 73 of the two transfer devices 51 and 53. On the other side of the memory cell shown in FIG. 2, the base of transistor 55 is coupled at node 72 between the current paths of the two transfer devices 50 and 52.

Each bit line of the pair of differential bit lines (read bit line 30 and read bit line bar 31) is coupled to a conventional constant current source 37. These conventional constant current sources are turned on during reading to provide constant current through the bit lines 30 and 31. The binary data retrieved from the memory cell is sensed by a conventional differential sense amplifier 36 which has differential inputs coupled between the read bit line 30 and the read bit line bar 31. Many well known configurations may be used to sense the complimentary signals present on the pair of differential bit lines formed by read bit line 30 and read bit line bar 31.

The array reference line 34 (ARREF) is coupled at node 59 to a voltage reference generating circuit which provides, in the preferred embodiment, a constant voltage of −1.3V. The array reference voltage on line 34 prevents the voltage applied at the base of the bipolar devices 54 and 55 from falling below −1.3V so that the base/emitter junction of these bipolar transistors 54 and 55 is always forward biased. In normal operation, the read word line 33 has two possible voltage states with respect to the array reference voltage applied on array reference line 34. These two possible states correspond to the two states of the row being selected for reading or not being selected for reading. In the first voltage state of read word line 33 (i.e., the nonselected state), the read word line has a voltage which is substantially equal to the voltage on the array reference line 34 (i.e., approximately −1.3V). In the second possible voltage state (i.e., the selected state) on the read word line 33, the read word line 33 is at a voltage which is approximately 0.5 volts above the array reference voltage on array reference line 34. In particular, when the cell is being selected for reading the read word line 33 will be pulled approximately 0.5 volts above the first reference voltage on the array reference line 34. In practice, the read word line 33 during the selection and reading of a memory cell will be in the range of 0.3 to 0.7 volts above the voltage on the array reference line 34. When the particular cell has not been selected for reading during a reading cycle, the read word line 33 will be maintained in the first voltage state in which the voltage on the read word line 33 is approximately equal to the voltage on the array reference line 34 and thus little or no current flows through the current paths of the transfer devices and there is no base current into the bipolar transistors 54 and 55.

The array reference voltage which is supplied to the array reference line 34 via node 59 is generated by bipolar transistors 60, 61 and 64 in conjunction with resistors 62, 63 and 65 and a conventional ECL current source reference voltage generator 70. The reference voltage generator 70 generates the typical ECL current source reference voltage which is well known and used with many ECL logic devices; this reference voltage generator is sometimes also referred to as a bandgap reference generator. In practice, the value of the array reference voltage is set as high as possible with respect to the read word line when it is selected. Typically, the read word line, when selected, is about 0.8 volts below the highest supply voltage (and hence is about −0.8 volts in the preferred embodiment since the transistor which pulls the RWL high will have a voltage drop across its base/emitter junction of about −0.8 volts). Given the considerations of noise and the number of cells on a read bit line, the array reference voltage is set 0.5 volts below the read word line when the RWL is selected. Hence, the array reference voltage is (0.8+0.5=1.3) volts below the highest supply voltage (hence −1.3 volts). The array reference voltage may be set in a range of from 1.0 volts to approximately 2.0 volts below the highest supply voltage.

The operation of the Bi-CMOS ECL semiconductor cell shown in FIG. 2 will now be described during reading. When the memory cell is not being selected during a read cycle, the read word line 33 will be maintained at approximately the same voltage as the array reference voltage on array reference line 34. Thus, no substantial current will flow through the collector emitter current path of either bipolar transistor 54 or bipolar transistor 55 and hence the memory cell 56 of FIG. 2 will not affect the logic states of the read bit line 30 and read bit line bar 31. However, when the memory cell 56 is selected for reading, the read word line 33 is pulled approximately 0.5V higher than the array reference voltage applied through node 59 to the array reference line 54. This causes the transfer gates to conduct and depending on the states of the complimentary outputs of the bistable circuit means, node 73 may be higher than node 72 or vice versa. For example, if node 70 is low, (while node 71 is high) node 73 will be pulled close to the voltage on the read word line 33 because p-channel device 51 couples the read word line 33 to node 73 while at the same time p-channel device 52 couples node 72 to the array reference line 34. In this manner, transistor 54 will pull the voltage on the read bit line bar 31 higher than the voltage on read bit line 30. In other words, the relative differences in the voltage across the on read bit lines 30 and 31 will be sensed by the sense amplifier 36. In this way, the bistable circuit means through the two pairs of transfer devices will modulate the read bit lines to allow data to be retrieved from the memory cell 56 shown in FIG. 2.

An alternative embodiment of the present invention is shown in FIG. 3. It can be seen that the memory cell 115 shown in FIG. 3 is different from the memory cell 56 of FIG. 2 because there is a single read port which is driven by bipolar transistor 112 via a single pair of transfer devices 110 and 111 which are coupled in series between the read word line 33 and the array reference line 34. The write port of the memory cell 115 is identical to the write port of the memory cell 56. That is, the write port of memory cell 115 includes a pair of differential writing bit lines (i.e., a write bit line 101 and a write bit line bar 100) which are coupled to the bistable circuit means (formed by devices 40, 41, 42 and 43) through the source/drain current paths of devices 44 and 45. The write word line 102 is to coupled the gates of the pass MOSFET devices 44 and 45 to permit writing in the conventional manner which was described above.

It can be seen that the complimentary outputs 70 and 71 from the bistable circuit means of FIG. 3 are coupled to the gates of the two transfer devices 110 and 111. The transfer devices 110 and 111 are identical p-channel enhancement field effect devices, each having a source and drain current path which are coupled together in series between the read word line 33 and the array reference line 34. The base of bipolar transistor 112 is coupled between the current paths of devices 110 and 111. The collector of transistor 112 is coupled to $V_{cc}$ and the emitter of transistor 112 is coupled to the read bit line 103.

The operation of the memory cell 115 as shown in FIG. 3 is substantially identical to the memory cell 56 described above except that there is a single read bit line rather than a pair of differential read bit lines and thus there is a conventional sense amplifier 23 coupled to the read bit line 103 as well as a constant current source 37 which is on during reading of any memory cell coupled along the column formed by read bit line 103. The relative voltage changes of the emitter of bipolar transistor 112 will determine the output from the sense amplifier 123 when the memory cell has been selected for reading. That is, when the base of transistor 112 is pulled close to the array reference voltage on line 34, the output of sense amplifier 23 will be low, and conversely, when the base of transistor 112 is pulled close to the voltage on the read word line 33, the output of sense amplifier 23 will be high. Of course, when the memory cell has not been selected, the read word line 33 will be at approximately the same voltage as the voltage on the array reference line 34.

FIG. 4 shows an embodiment of an alternative to the memory cell shown in FIG. 1 which utilizes a pair of write bit lines and a pair of read bit lines. This embodiment has substantially the same flaws as the embodiment shown in FIG. 1. In other words, the emitter based junction of the bipolar transistors 166 and 167 will often become reverse biased and the reliability of the memory cell will consequently decrease over time. It can be seen that the reverse biased situation will occur for one transistor but not the other when that one transistor has its base pulled low.

FIG. 5 shows an example of an array of memory cells 56 in which there are two columns of memory cells and two rows of memory cells. The first column of memory cells is formed between read bit line 175 and read bit line bar 176. The second column of memory cells is shown between read bit line 177 and read bit line bar 178. The first row of memory cells is coupled to write word line 1 (185) and read word line 1 (186), while the second row of memory cells is coupled to the write word line 2 (188) and the read word line 2 (189). Those ordinarily skilled in the art will appreciate that only one row of memory cells may be read at a single point in time depending upon which row is selected for reading by pulling the read word line for that particular row higher than the array reference voltage on array reference line 187 which receives the array reference voltage through node 59. An example of an embodiment of a constant current source 37 for providing a constant current source for the read bit lines (i.e., RBL and RBLB) is shown in FIG. 5. Specifically, transistors 201, 202 resistor 203, transistor 204, transistor 205 and transistor 206 in conjunction with transistors 200 and 207 form a constant current source to provide a constant current for the read bit line 175 and the read bit line bar 176. A particular column may be selected for reading using conventional address decoders to select one of the columns for reading while the other columns are not selected for reading. It will be appreciated that the output signals from a conventional address decoder will provide the column address signals Y0 and Y1 shown on FIG. 5 to select either column.

While this invention has been described with reference to illustrative embodiments, this description is not intended to be construed in the limiting sense. Various modifications of these embodiments, such as the use of other types of standard circuitry and other embodiments of semiconductor memory devices, will be apparent to a person skilled in the art upon reference to this description. For example, the invention may be implemented in various logic families such as ECL, TTL or CMOS.

I claim:

1. A semiconductor memory cell for storing binary data having a read word line and a read bit line, said cell comprising:
   a bistable circuit means having complimentary outputs being a first output and a second output;
   a first transfer device and a second transfer device, said first transfer device having a first gate electrode and a first current path, and said second transfer device having a second gate electrode and a second current path, said first gate electrode being coupled to said first output and said second gate electrode being coupled to said second output, said first current path and said second current path being coupled in series between said read word line and a first reference voltage;
   a transistor means having a control electrode and two other electrodes, said control electrode being coupled to a node between said first and said second current paths, and said two electrodes having a current path one end of which is coupled to said read bit line and the other end being coupled to a second reference voltage.

2. A Bi-CMOS semiconductor memory cell for storing binary data having a read word line and a read bit line, said cell comprising:
   a bistable circuit means having complimentary outputs being a first output and a second output;
   a first transfer device and a second transfer device, said first transfer device having a first gate electrode and a first current path, and second transfer device having a second gate electrode and a second current path, said first gate electrode being coupled to said first output and said second gate electrode being coupled to said second output, said first current path and said second current path being coupled in series between said read word line and a first reference voltage;
   a bipolar transistor device having a base and a collector and an emitter, said collector and said emitter forming a third current path, said base being coupled to a node between said first and said second current paths, one end of said third current path being coupled to a second reference voltage and the other end of said third current path being coupled to said read bit line.

3. A Bi-CMOS semiconductor memory cell as in claim 2 wherein said first reference voltage is set such that the base/emitter junction of said bipolar transistor device is always forward biased.

4. A Bi-CMOS semiconductor memory cell as in claim 2 wherein said read word line has a first and a second possible voltage states with respect to said first reference voltage, said first possible voltage state being substantially equal to said first reference voltage and said second possible voltage state being above said first reference voltage.

5. A Bi-CMOS semiconductor memory cell as in claim 4 wherein said second possible voltage state is in the range of 0.3 to 0.7 volts above said first reference voltage.

6. A Bi-CMOS semiconductor memory cell as in claim 5 wherein said one end of said third current path is said collector of said bipolar transistor and said other end of said third current path is said emitter of said bipolar transistor.

7. A Bi-CMOS ECL semiconductor memory cell for storing binary data having a read word line, a read bit line and a complimentary read bit line, said cell comprising:
   a bistable circuit means having complimentary outputs being a first and a second output;
   a first transfer device and a second transfer device, said first transfer device having a first gate electrode and a first current path, and said second transfer device having a second gate electrode and a second current path, said first gate electrode being coupled to said first output and said second gate electrode being coupled to said second output, said first current path and said second current path being coupled in series between said read word line and a first reference voltage;
   a third transfer device and a fourth transfer device, said third transfer device having a third gate electrode and a third current path, and said fourth transfer device having a fourth gate electrode and a fourth current path, said third gate electrode being coupled to said second gate electrode and said fourth gate electrode being coupled to said first gate electrode, said third current path and said fourth current path being coupled in series between said read word line and said first reference voltage;
   a first bipolar transistor and a second bipolar transistor, said first bipolar transistor having a first base and a first collector and a first emitter, said second bipolar transistor having a second base and a second collector and a second emitter, said first base being coupled between said first current path and said second current path, and said second base being coupled between said third current path and said fourth current path, said first collector and said second collector being coupled to a second reference voltage, said first emitter being coupled to said complimentary read bit line and said second emitter being coupled to said read bit line.

8. A Bi-CMOS ECL semiconductor memory cell as in claim 7 wherein said cell further comprises a write word line coupled to said bistable circuit means for writing binary data into said cell, a write bit line and a complimentary write bit line coupled to said bistable circuit means for writing binary data into said cell, said complimentary write bit line having a value corresponding to the logical inverse of the value on said write bit line during writing into said cell.

9. A Bi-CMOS ECL semiconductor memory cell as in claim 8 wherein said read word line has two possible voltage states with respect to said first reference voltage, said first possible voltage state being substantially equal to said first reference voltage and said second possible voltage state being above said first reference voltage.

10. A Bi-CMOS ECL semiconductor cell as in claim 9 wherein said second possible voltage state is in the range of 0.3 to 0.7 volts above said first reference voltage, and said first reference voltage is fixed sufficiently above the lowest voltage supply provided to said cell such that the base/emitter junctions of said first and said second bipolar transistors are always forward biased.

11. A Bi-CMOS ECL semiconductor cell as in claim 10 wherein said first reference voltage is approximately −1.3 volts and said second reference voltage is approximately 0 voltages and the lowest voltage supply provided to said cell is approximately −5.2 volts.

* * * * *